US008581596B2

(12) United States Patent
Kagoshima

(10) Patent No.: US 8,581,596 B2
(45) Date of Patent: Nov. 12, 2013

(54) CURRENT LEAKAGE DETECTOR OF CONSTRUCTION MACHINE

(75) Inventor: Masayuki Kagoshima, Hiroshima (JP)

(73) Assignee: Kobelco Construction Machinery Co., Ltd., Hiroshima-shi (JP)

( * ) Notice: Subject to any disclaimer, the term of this patent is extended or adjusted under 35 U.S.C. 154(b) by 249 days.

(21) Appl. No.: 12/859,876

(22) Filed: Aug. 20, 2010

(65) Prior Publication Data

US 2011/0057596 A1 Mar. 10, 2011

(30) Foreign Application Priority Data

Sep. 7, 2009 (JP) ................................. 2009-206046

(51) Int. Cl.
| | |
|---|---|
| *G01R 31/08* | (2006.01) |
| *G01R 31/00* | (2006.01) |
| *G01R 31/14* | (2006.01) |
| *G01R 31/28* | (2006.01) |
| *G08B 21/00* | (2006.01) |
| *H02H 9/00* | (2006.01) |

(52) U.S. Cl.
USPC ........... 324/522; 324/503; 324/510; 324/511; 340/635; 290/40 C; 361/56

(58) Field of Classification Search
USPC .................................................. 324/509, 503
See application file for complete search history.

(56) References Cited

U.S. PATENT DOCUMENTS

| | | | | | |
|---|---|---|---|---|---|
| 5,686,839 | A | * | 11/1997 | Takagi | 324/503 |
| 6,266,901 | B1 | * | 7/2001 | Kanda et al. | 37/403 |
| 6,919,726 | B2 | * | 7/2005 | Yudahira | 324/522 |
| 7,279,801 | B2 | * | 10/2007 | Kagoshima | 290/40 C |
| 2002/0011935 | A1 | * | 1/2002 | Kim | 340/635 |
| 2009/0121672 | A1 | | 5/2009 | Endou | |
| 2009/0184718 | A1 | * | 7/2009 | Ivan et al. | 324/522 |

FOREIGN PATENT DOCUMENTS

| | | |
|---|---|---|
| CN | 101031449 A | 9/2007 |
| CN | 101228447 A | 7/2008 |
| CN | 100446372 C | 12/2008 |
| EP | 1 981 143 A1 | 10/2008 |
| JP | 2006-194804 A | 7/2006 |
| WO | WO 2007/007749 A1 | 1/2007 |

OTHER PUBLICATIONS

U.S. Appl. No. 12/859,832, filed Aug. 20, 2010, Kagoshima.
Combined Chinese Office Action with English Summary and Search Report with English Translation of Category of Cited Documents issued Oct. 9, 2012 in Patent Application No. 201010275323.3.

* cited by examiner

*Primary Examiner* — Jermele M Hollington
*Assistant Examiner* — Christopher McAndrew
(74) *Attorney, Agent, or Firm* — Oblon, Spivak, McClelland, Maier & Neustadt, L.L.P.

(57) ABSTRACT

An inverter is forcibly operated to supply electric power to a motor, thereby performing detection of a current leakage, on condition that a power-on operation is performed, that the motor is stopped, and that determination as to occurrence or non-occurrence of the current leakage has not yet been made even once after the power-on.

4 Claims, 4 Drawing Sheets

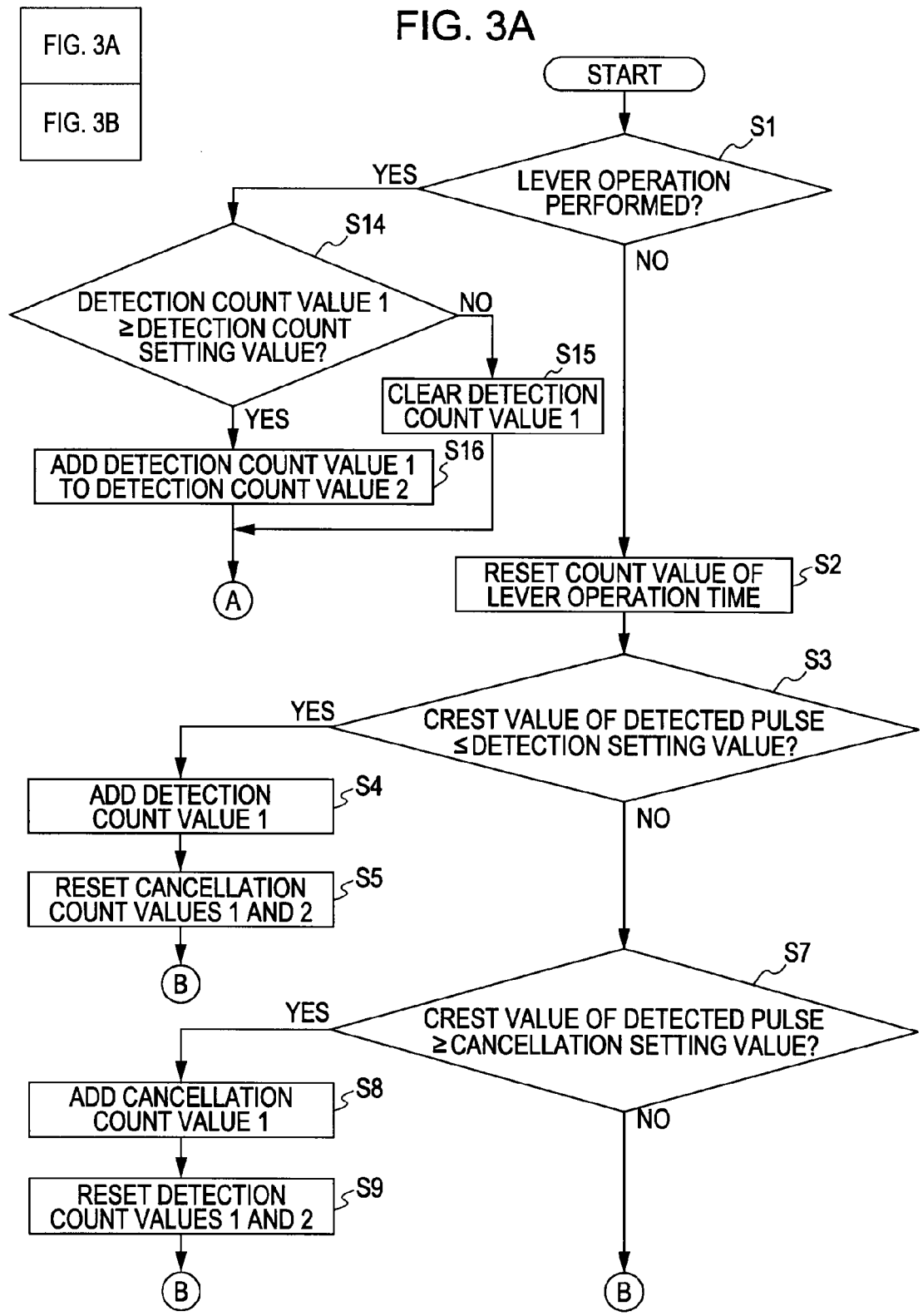

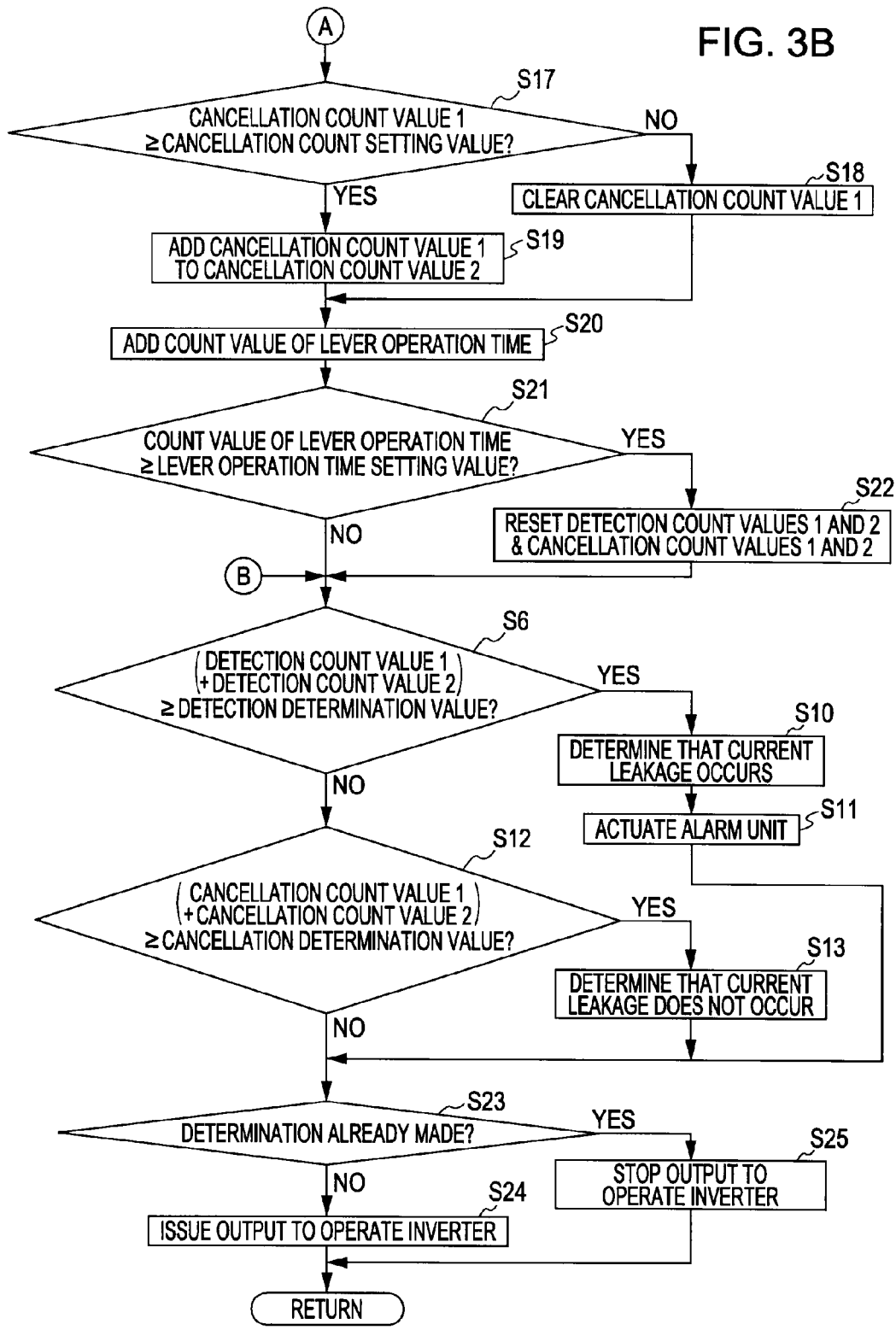

CURRENT LEAKAGE DETECTOR OF CONSTRUCTION MACHINE

BACKGROUND OF THE INVENTION

1. Field of the Invention

The present invention relates to a current leakage detector for detecting a current leakage of a motor drive circuit in a construction machine, e.g., a hybrid shovel or a battery shovel, in which a motor is driven by a battery.

2. Description of the Related Art

Hitherto, regarding the technology for detecting a current leakage in a battery-loaded vehicle such as a hybrid car, there is known a technique of applying a test voltage, e.g., a sine wave or a pulse wave, between a circuit bus and a machine body (ground) and measuring a crest value of the test voltage, as disclosed in Patent Document WO2007/007749.

The known technique utilizes the fact that, if a current leakage occurs due to, e.g., an insulation failure, the crest value of the test voltage is reduced to be lower than a reference value due to generation of current leakage resistance. The occurrence of the current leakage is determined when the crest value lower than the reference value is detected.

However, when the known technique is applied to a construction machine (e.g., a shovel which is taken as an example in a description below), the following problem arises.

In the shovel, an upper swivel structure provided with a working attachment is mounted on a crawler-type lower traveling structure to be able to swivel (rotate) about an axis normal to the ground surface.

A swivel motor for swiveling the upper swivel structure is driven through an inverter in a hybrid shovel that utilizes engine power and battery power in a combined manner, or in a battery shovel that utilizes only a battery as a power source.

The inverter includes a plurality of switching devices. In a swivel operation, the switching devices are turned on to bring the inverter into an operated state, whereby electric power is supplied to the swivel motor.

Speaking contrariwise, unless the swivel operation is performed, the inverter is not operated and electric power is not supplied to the swivel motor.

Further, unless electric power is supplied to the swivel motor, the detection of the current leakage cannot be performed by using the above-described technique.

This gives rise to the problem that the detection of the current leakage cannot be performed in a swivel stopped state.

More specifically, the above-described problem is attributable to such setting in view of a situation specific to the swivel motor that, in the swivel stopped state, the upper swivel structure is positively held stopped on, e.g., a sloped road by a swivel brake to be avoided from swiveling following a downward slope due to its own load, while the supply of electric power to the motor is cut off for energy saving.

To cope with that problem, it is conceivable to perform the detection of the current leakage during a period in which the swivel motor is operated, i.e., during the operation. However, start/stop of operation of the swivel motor is frequently repeated, and a battery voltage is abruptly varied correspondingly. Therefore, such a solution increases a possibility of erroneous detection, for example, that a current leakage state is determined in spite of a current leakage being not actually generated.

The above-described problem is experienced in not only the swivel motor, but also in all of other motors used in shovels or other construction machines in which the motors are driven through inverters and the supply of electric power is cut off in a motor stopped state.

SUMMARY OF THE INVENTION

The present invention provides a current leakage detector capable of, in a construction machine provided with a motor drive circuit for driving a motor by a battery through an inverter, detecting a current leakage of the motor drive circuit in a motor stopped state.

The current leakage detector of the construction machine, according to the present invention, includes a motor drive circuit for driving a motor by a battery through an inverter, the inverter supplying electric power to the motor to drive the motor when operating means is operated and cutting off supply of the electric power to the motor when the operating means is not operated. The current leakage detector further includes signal output means for applying a voltage signal, which is adapted for detection of a current leakage, between the motor drive circuit and a body of the construction machine, signal detection means for detecting the voltage signal applied by the signal output means, motor operation detection means for detecting whether the motor is in an operated state or in a stopped state, and determination means for determining occurrence or non-occurrence of the current leakage based on the signal detected by the signal detection means, the determination means operating the inverter to bring the motor into a power supplied state regardless of the operation of the operating means and determining the occurrence or non-occurrence of the current leakage in the power supplied state of the motor when following conditions are satisfied:

(A) a power-on operation for connecting the battery to the inverter is performed, (B) the motor is in the stopped state, and (C) the determination as to the occurrence or non-occurrence of the current leakage has not yet been made even once.

According to the present invention, in an operation stopped state, the inverter is forcibly operated to supply the electric power to the motor, thereby performing the detection of the current leakage, on condition that the power-on operation is performed, that the motor is stopped, and that the determination as to the occurrence or non-occurrence of the current leakage has not yet been made even once after the power-on. Regarding the motor drive circuit for which the supply of the electric power is cut off in the operation stopped state as in the case of using a swivel motor, therefore, the reliable determination as to the current leakage can be made without being affected by a variation in a battery voltage.

Further, since the detection of the current leakage is performed only once immediately after the power-on, the current leakage detector is free from such a drawback as unduly delaying the start of work and deteriorating efficiency of the work.

In the above-described constitution of the current leakage detector according to the present invention, preferably, the determination means counts a low crest value time in which a crest value of the voltage signal detected by the signal detection means is not more than a setting value (i.e., a signal indicating a current leakage state) and a high crest value time in which the crest value of the voltage signal detected by the signal detection means exceeds a setting value (i.e., a signal indicating a normal state), determines occurrence of the current leakage state when a count value of the low crest value time is not less than a setting value, and determines non-occurrence of the current leakage state when a count value of the high crest value time is not less than a setting value. Therefore, the influence of temporary noise can be eliminated and the determination as to the current leakage state or the normal state can be performed with higher reliability.

Usually, because the determination as to the occurrence or non-occurrence of the current leakage is made in a way not consciously recognized by an operator, there is a possibility that the operation of the operating means is started and the motor is brought into the operated state during a determination process.

To cope with such a possibility, in the above-described constitution of the current leakage detector according to the present invention, the determination means preferably suspends the determination when the operation of the motor is detected by the motor operation detection means during the determination as to the occurrence or non-occurrence of the current leakage. With that feature, since the determination as to the occurrence or non-occurrence of the current leakage is suspended when the motor is operated after the start of the determination process, erroneous detection can be prevented which may be caused by an influence of the variation in the battery voltage.

Further, in the above-described constitution of the current leakage detector according to the present invention, the determination means preferably determines the occurrence or non-occurrence of the current leakage with respect to a drive circuit of a swivel motor for swiveling an upper swivel structure mounted on a lower traveling structure.

BRIEF DESCRIPTION OF THE DRAWINGS

FIG. 3 is a flowchart to explain the flow of a determination process in the current leakage detector.

DESCRIPTION OF THE PREFERRED EMBODIMENTS

In an embodiment described below, the present invention is applied to a hybrid shovel which utilizes engine power and battery power in a combined manner.

Figure 1:
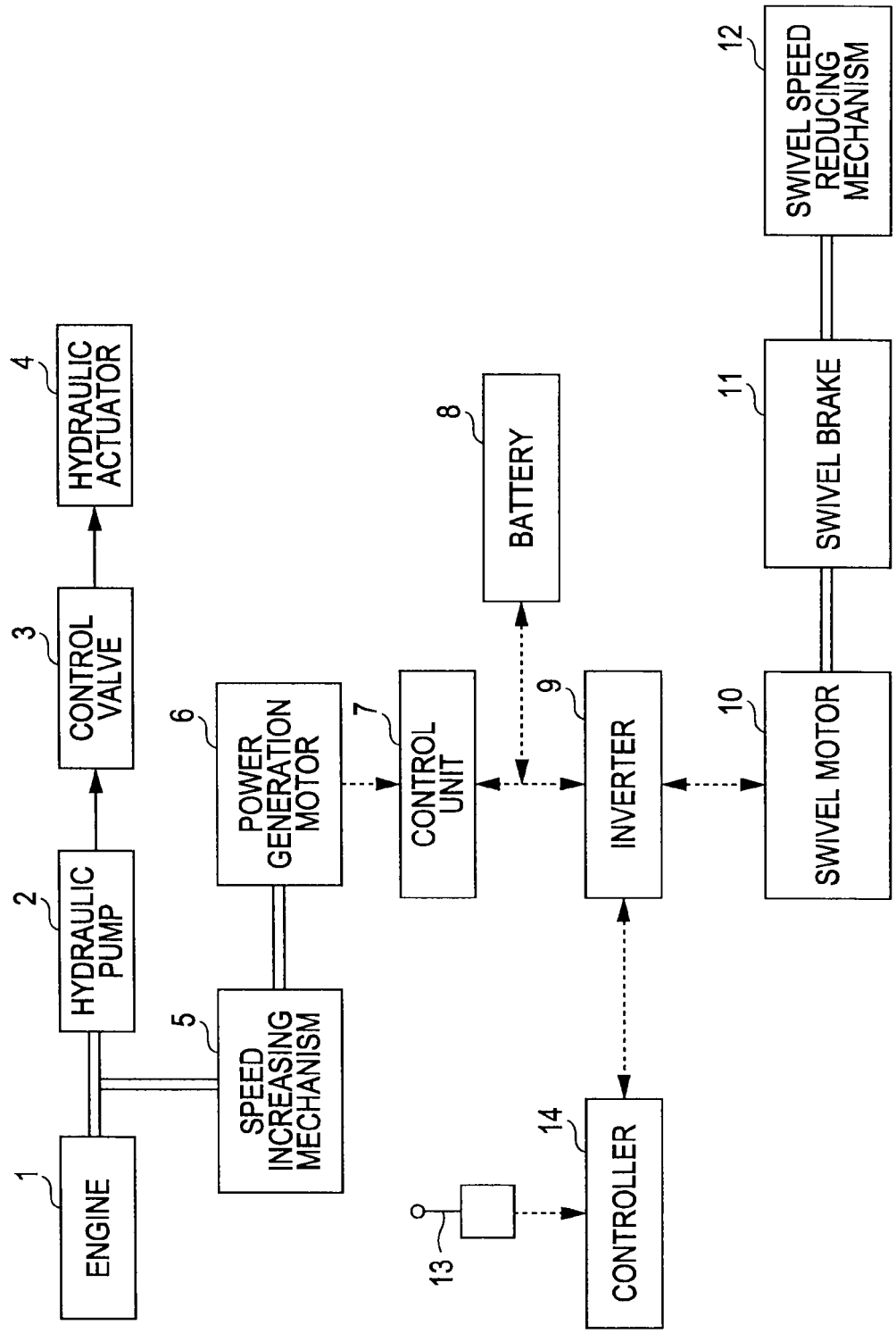
FIG. 1 is a block diagram of a drive system and a control system in a hybrid shovel to which the present invention is applied.

FIG. 1 is a block diagram of a drive system and a control system, which are generally used in the hybrid shovel.

A hydraulic pump 2 is connected to an engine 1, and oil delivered from the hydraulic pump 2 is supplied to a hydraulic actuator 4 (which is representatively illustrated here, although an actual machine includes hydraulic cylinders for a boom, an arm and a bucket and a hydraulic motor for traveling) through a control valve 3.

An output of the engine 1 is applied to a power generation motor 6 through a speed increasing mechanism 5. Electric power produced by the power generation motor 6 is accumulated in a battery 8 through a control unit 7 which controls a voltage and a current. The electric power is further applied to a swivel motor 10 through an inverter 9.

The power generation motor 6 also operates as a motor with the electric power stored in the battery 8, thereby assisting the engine 1 as required.

The swivel motor 10 is provided with a swivel brake 11 for holding the swivel motor 10 in a stopped state. When the swivel brake 11 is in a released state, a rotating force (torque) of the swivel motor 10 is transmitted to an upper swivel structure of the shovel through a swivel speed reducing mechanism 12, whereupon the upper swivel structure is swiveled (rotated) clockwise or counterclockwise.

At that time, a voltage of the battery 8 varies with the rotation of the swivel motor 10. If such a variation in the battery voltage occurs during a later-described process of determining a current leakage, there arises a possibility of erroneous detection.

Reference numeral 13 denotes a swivel operating lever, which serves as one of operating means. In accordance with an operation signal from the operating lever 13, a command signal is output from a controller 14 to the inverter 9, whereupon the swivel motor 10 is controlled.

Figure 2:
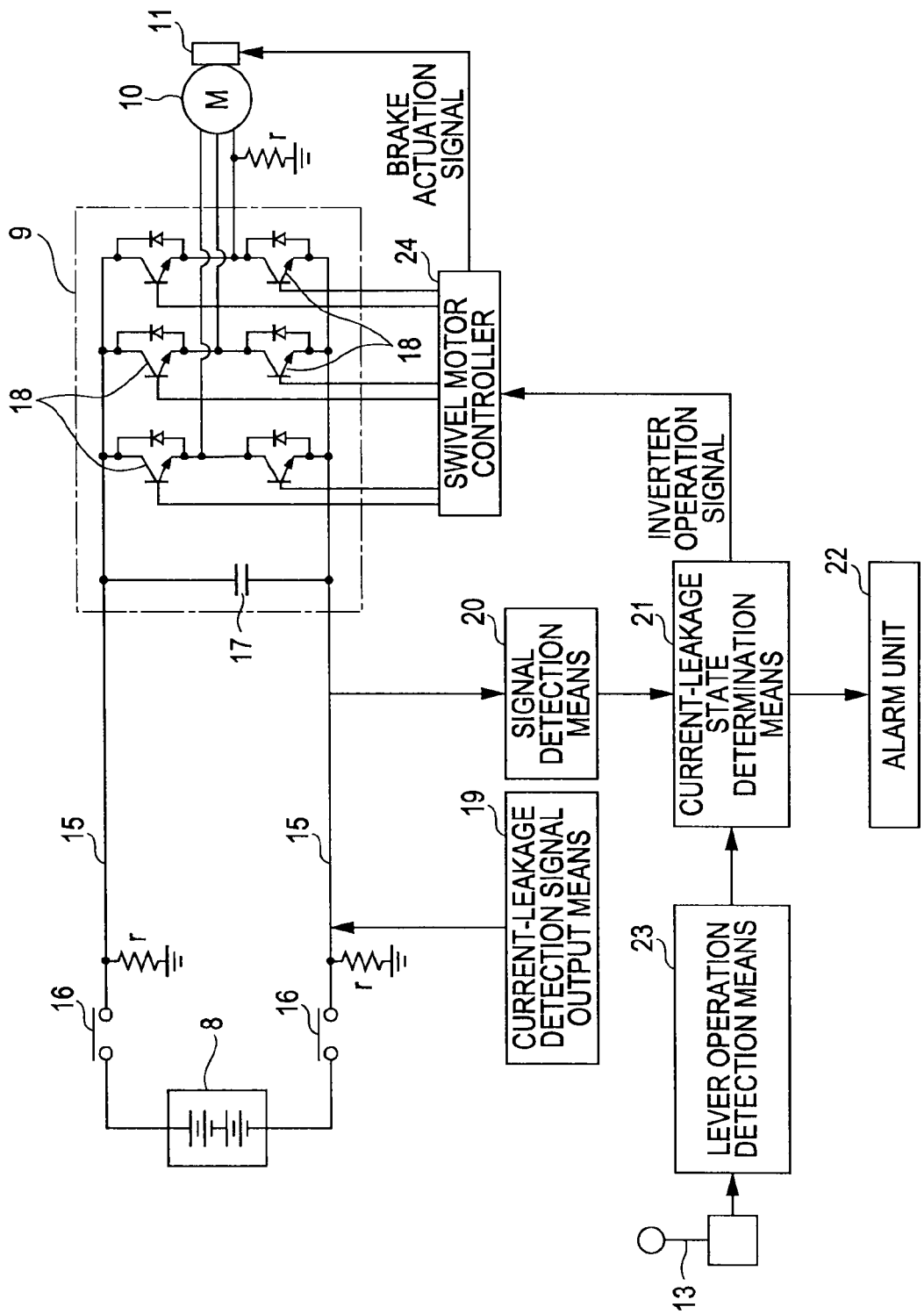
FIG. 2 illustrates the system configuration of a current leakage detector for a motor drive circuit according to an embodiment of the present invention.

FIG. 2 illustrates the system configuration of a current leakage detector.

The embodiment is constructed so as to detect, in a motor drive circuit for driving the swivel motor 10 by the battery 8 through the inverter 9, a current leakage between the motor drive circuit and a not-shown machine body (ground).

Here, the term "machine body" implies an upper frame of the upper swivel structure in the case of the shovel, the upper frame being grounded through a swivel bearing and a lower traveling structure.

In FIG. 2, reference numerals 15 and 15 denote DC buses of the motor drive circuit, 16 and 16 denote relays (contacts) disposed respectively in the buses 15 and 15 for connection to the battery 8, 17 denotes a capacitor in the inverter 9, 18 denotes a plurality of switching devices, and 10a denotes 3-phase AC lines between the inverter 9 and the swivel motor 10. Further, a reference character r represents current leakage resistance that is generated with a current leakage.

In the motor drive circuit described above, the inverter 9 is brought into an operated state upon turning-on of the switching devices 18. As a result, electric power is supplied to the swivel motor 10 and the swivel motor 10 is driven in accordance with the operation of the operating lever 13.

The current leakage detector includes current-leakage detection signal output means 19 for applying a voltage signal (e.g., a pulse voltage at a particular frequency), which is adapted for detection of the current leakage, to the motor drive circuit, specifically between the DC buses 15, 15 and the body, for example, signal detection means 20 for detecting the applied voltage signal, current-leakage state determination means 21, an alarm unit 22 for issuing an alarm in accordance with a signal output from the current-leakage state determination means 21 when the occurrence of the current leakage is determined, lever operation detection means 23 for detecting whether the operating lever 13 is operated or not, and a swivel motor controller 24 for controlling start/stop of operation of the inverter 9 through the switching devices 18 in accordance with a signal from the current-leakage state determination means 21.

Further, in accordance with a signal from the lever operation detection means 23, the swivel motor controller 24 releases the swivel brake 11 when the operating lever is operated, and actuates the swivel brake 11 when the operating lever is not operated.

The current-leakage state determination means 21 determines the occurrence or non-occurrence of the current leakage based on a crest value of the signal detected by the signal detection means 20 and on whether the swivel motor 10 (or the operating lever) is operated or not.

As described above, the swivel motor 10 is operated in accordance with the operation of the operating lever 13. This implies that whether the swivel motor 10 is operated or not can be indirectly detected by detecting whether the operating lever 13 is operated or not.

In the current leakage detector according to the embodiment, therefore, whether the operating lever 13 is operated or not is detected by using the lever operation detection means (e.g., a potentiometer) 23 instead of detecting the motor operation state, and the detected signal is input, as a motor operation state signal, to the current-leakage state determination means 21.

The current-leakage state determination means 21 operates the inverter 9 through the swivel motor controller 24 to bring the swivel motor into a state supplied with electric power, and then determines the occurrence or non-occurrence of the current leakage in the power supplied state when the following conditions are satisfied:

(A) a power-on operation for connecting the battery 8 to the inverter 9 is performed, (B) the swivel motor 10 is in the stopped state, and (C) the determination as to the occurrence or non-occurrence of the current leakage has not yet been made even once.

Be it noted that, even when the swivel motor 10 is brought into the power supplied state with the operation of the inverter 9, no torque is generated in the swivel motor 10 unless the lever operation is performed; namely the swivel motor 10 is just supplied with electric power and remains stopped with torque kept at 0.

The power-on operation in above (A) implies that the relays 16 and 16 in FIG. 2 are turned on in response to turning-on of an engine key switch (not shown).

A practical determination process can be performed as follows. Taking into account that the crest value of the detected signal (in the form of a pulse voltage) does not exceed a setting value in the current leakage state, but it exceeds the setting value in the current non-leakage state, the current-leakage state determination means 21 counts a time in which the crest value does not exceed the setting value (called a "low crest value time") and a time in which the crest value exceeds the setting value (called a "high crest value time"). Then, the current-leakage state determination means 21 determines that the state current leakage is present, when a count value of the low crest value time is not less than a setting value for the count value of the low crest value time, and determines that the current leakage state is not present (i.e., current non-leakage state=normal state), when a count value of the high crest value time is not less than a setting value for the count value of the high crest value time.

Be it noted that the low crest value time and the high crest value time may be each a time during which the low crest value or the high crest value is continuously detected, or a time derived from the numbers of pulses representing the low crest value or the high crest value.

When the lever operation (i.e., the operation of the motor) is detected by the lever operation detection means 23 during the determination process, the counting of the low crest value time and the high crest value time is interrupted (namely, the detection of the current leakage is suspended) in consideration of a risk that erroneous detection may occur due to a variation in the battery voltage.

Details of the current discharge determination process, which is executed by the current-leakage state determination means 21, will be described below with reference to a flowchart of FIG. 3.

In the flow illustrated in FIG. 3, determination process steps (S1 to S22) are first executed, and whether the determination has already been made or not after power-on is then determined in step S23.

If the determination result in step S23 is "NO" (i.e., if the determination has not yet been made even once), the switching devices 18 of the inverter 9 are turned on through the swivel motor controller 24 in FIG. 2, whereupon the inverter 9 is brought into the operated state. Thus, electric power is supplied to the swivel motor 10 and a state capable of detecting the current leakage is established. In such a state, the determination process subsequent to step S1 is executed.

On the other hand, if the determination result in step S23 is "YES" (i.e., if the determination has already been made), the determination process is brought to an end.

The determination process steps will be described below, starting from step S1.

A. When Lever Operation is not Performed During Determination

In step S1, whether the lever operation is performed or not is determined. If there is no lever operation ("NO"), the determination process advances to a current leakage detection flow, and if there is the lever operation ("YES"), the determination process advances to a current-leakage detection suspension flow.

In the flow of FIG. 3, the term "count value" implies a count value of the low crest value time or the high crest value time, the term "detection count value" implies a count value of the low crest value time, and the term "detection setting value" implies a threshold set for determining whether the detected crest value is the low crest value or not. Further, the term "cancellation count value" implies a count value of the high crest value time, and the term "cancellation setting value" implies a threshold set for determining whether the detected crest value is the high crest value or not.

Regarding the count value, the term "count value 1" implies a current count value, and the term "count value 2" implies a past count value that has been stored. Further, the term "detection count setting value" implies a threshold set for the detection count value, and the term "cancellation count setting value" implies a threshold set for the cancellation count value.

In the current leakage detection flow, a count value of a lever operation time is first reset in step S2. The flow then shifts to step S3.

In step S3, it is determined whether the crest value of the detected pulse is not more than the detection setting value (i.e., whether it indicates the current leakage state). If the determination result is "YES" (i.e., if the current leakage state is indicated), the detection count value 1 is added in step S4 to count the low crest value time, and the cancellation count values 1 and 2 are reset in step S5. Thereafter, the flow shifts to step S6.

On the other hand, if the determination result in step S3 is "NO" (i.e., crest value of detected pulse>detection setting value), the flow shifts to step S7 in which it is determined whether the crest value of the detected pulse is not less than the cancellation setting value. If the determination result in step S7 is "YES", the flow advances in order of step S8, step S9, and step S6. If the determination result in step S7 is "NO", the flow directly advances to step S6.

In step S8, the cancellation count value 1 is added to count the high crest value time. In step S9, the detection count values 1 and 2 are reset.

In step S6, the count value of the low crest value time (i.e., the total value of the detection count values 1 and 2) is compared with a detection determination value that is a count value as a reference for determining the current leakage state. If the former is not less than the latter, it is determined in step S10 that the current leakage occurs. The alarm unit 23 in FIG. 2 is actuated in step S11 so as to notify an operator of the occurrence of the current leakage. Thereafter, the flow returns to step S1.

On the other hand, if the count value of the low crest value time is less than the detection determination value (if the determination result in step S6 is "NO"), the count value of the high crest value time (i.e., the total value of the cancellation count values 1 and 2) is compared in step S12 with a cancellation determination value that serves as a reference for determining cancellation of the detection of the current leakage. If the former is not less than the latter (i.e., if the determination result in step S12 is "YES"), it is determined in step S13 that the current leakage does not occur. Thereafter, the flow shifts to step S23. If the determination result in step S12 is "NO", the flow directly shifts to step S23.

B. When Lever Operation is Performed During Determination

If the determination result in step S1 is "YES" (i.e., if the lever operation is performed), the detection of the current leakage is interrupted as follows. First, in step S14, it is determined whether the count value of the low crest value time during a period from start to interruption of the counting (i.e., the detection count value 1) is not less than the detection count setting value that serves as a threshold. If the determination result in step S14 is "NO" (i.e., if the former is less than the latter), the relevant count value is cleared in step S15. If the determination result in step S14 is "YES" (i.e., if the former is not less than the latter), the count value is stored (namely, the detection count value 1 is added to the detection count value 2) in step S16.

In subsequent step S17, it is determined whether the count value of the high crest value time during the period from start to interruption of the counting (i.e., the cancellation count value 1) is not less than the cancellation count setting value that serves as a threshold. If the determination result in step S17 is "NO" (i.e., if the former is less than the latter), the relevant cancellation count value 1 is cleared in step S18. If the determination result in step S17 is "YES" (i.e., if the former is not less than the latter), the count value is stored (namely, the cancellation count value 1 is added to the cancellation count value 2) in step S19.

In step S20, the count value of the lever operation time is added. In step S21, the resulting count value is compared with a lever operation time setting value that is a threshold set for the lever operation time.

If the determination result in step S21 is "YES" (i.e., count value of lever operation time≥lever operation time setting value), the detection count values 1 and 2 and the cancellation count values 1 and 2 are reset in step S22, following which the flow shifts to step S23. If the determination result in step S21 is "NO", the flow directly shifts to step S23.

Further, only when the determination result in step S23 is "NO" (i.e., if the determination has not yet been made), an output to operate the inverter is issued and the determination process is executed from step S1.

Thus, according to the current leakage detector of the embodiment, the inverter 9 is forcibly operated to supply the electric power to the swivel motor 10, thereby performing the detection of the current leakage, on condition that the power-on operation is performed, that the swivel motor 10 is in the stopped state, and that the determination as to the occurrence or non-occurrence of the current leakage has not yet been made even once after the power-on. Regarding the swivel motor drive circuit for which the supply of the electric power is cut off in the operated stopped state, therefore, the reliable determination as to the current leakage can be made without being affected by the variation in the battery voltage.

Further, since the detection of the current leakage is performed only once immediately after the power-on, the current leakage detector is free from such a drawback as unduly delaying the start of work and deteriorating efficiency of the work.

Still further, in steps S4 to S12, the low crest value time in which the crest value of the pulse voltage detected by the signal detection means 20 is not more than the setting value (i.e., the signal indicating the current leakage state) and the high crest value time in which the crest value of the detected pulse voltage is not less than the setting value (i.e., the signal indicating the normal state) are counted. If the count value of the low crest value time is not less than the setting value, it is determined that the current leakage state is present, and if the count value of the high crest value time is not less than the setting value, it is determined that the current leakage state is not present. Therefore, the influence of temporary noise can be eliminated and the determination as to the current leakage state or the normal state can be performed with higher reliability.

Moreover, when the swivel motor 10 is operated with the lever operation after the start of the determination process, the process for determining the occurrence or non-occurrence of the current leakage is suspended (interrupted). As a result, erroneous detection caused by an influence of the variation in the battery voltage can be prevented.

In that case, in steps S14 to S21, if respective count values of the low crest value time and the high crest value time during the period from start of the counting to its interruption due to the operation of the motor are not less than the setting values, those count values are stored to be ready for restart of the counting after the interruption. If the count values are less than the setting values, those count values are cleared because they are not enough as data for making the determination. In addition, if the interruption of the counting of the low crest value time and the high crest value time continues for a setting time or longer, the count values are cleared on judgment that they are the past data to be discarded. As a result, accuracy in the determination can be increased.

While the lever operation detection means 23 detects the operation state of the swivel motor 10 in the embodiment described above, the operation state of the swivel motor 10 may be directly detected instead.

Further, the present invention can be applied to not only the hybrid shovel, but also to a battery shovel employing only a battery as a power source and other battery-loaded construction machines than the shovels in a similar manner to that in the embodiment described above.

Although the invention has been described with reference to the preferred embodiments in the attached figures, it is noted that equivalents may be employed and substitutions made herein without departing from the scope of the invention as recited in the claims.

What is claimed is:

1. A construction machine comprising:
   a lower traveling structure;
   an upper swivel structure mounted on the lower traveling structure;
   a swivel motor for swiveling the upper swivel structure;
   a swivel brake to be actuated to hold the swivel motor in a stopped state;
   a swivel operating lever to be operated for driving the swivel motor to swivel the upper swivel structure;
   a motor drive circuit for driving the swivel motor by a battery through an inverter, the inverter supplying electric power to the swivel motor to drive the swivel motor when the swivel operating lever is operated to swivel the upper swivel structure and cutting off supply of the electric power to the swivel motor when the swivel operating lever is not operated;
   a swivel motor controller for controlling the operation of the inverter, the swivel motor controller being adapted to release the swivel brake when the swivel operating lever is operated to swivel the upper swivel structure, and to actuate the swivel brake when the swivel operating lever is not operated;

signal output means for applying a voltage signal, which is adapted for detection of a current leakage, between the swivel motor drive circuit and a body of the construction machine;

signal detection means for detecting the voltage signal applied by the signal output means;

lever operation detection means for detecting whether the swivel operating lever is operated to swivel the upper swivel structure or not; and determination means for determining occurrence or non-occurrence of the current leakage based on the signal detected by the signal detection means, the determination means operating the inverter through the swivel motor controller to bring the swivel motor into a power supplied state where the swivel motor is just supplied with the electrical power so as to generate no torque unless the swivel operating lever is operated and determining the occurrence or non-occurrence of the current leakage in the power supplied state of the swivel motor when following conditions are satisfied:

(A) a power-on operation for connecting the battery to the inverter is performed, (B) the swivel operating lever is not operated to swivel the upper swivel structure, and (C) the determination as to the occurrence or non-occurrence of the current leakage has not yet been made even once.

2. The construction machine according to claim 1, wherein the determination means counts a low crest value time in which a crest value of the voltage signal detected by the signal detection means is not more than a setting value and a high crest value time in which the crest value of the voltage signal detected by the signal detection means exceeds a setting value, determines occurrence of a current leakage state when a count value of the low crest value time is not less than a setting value, and determines non-occurrence of the current leakage state when a count value of the high crest value time is not less than a setting value.

3. The construction machine according to claim 1, wherein the determination means suspends the determination when the operation of the swivel operating lever is detected by the motor operation detection means during the determination as to the occurrence or non-occurrence of the current leakage.

4. The construction machine according to claim 1, wherein the inverter includes a plurality of switching devices, and wherein all of said switching devices are turned on to supply the swivel motor with the electrical power so as to generate no torque.

* * * * *